(12) United States Patent
Cafiero et al.

(10) Patent No.: US 8,727,793 B2
(45) Date of Patent: May 20, 2014

(54) OPTICAL MODULE DESIGN IN AN SFP FORM FACTOR TO SUPPORT INCREASED RATES OF DATA TRANSMISSION

(75) Inventors: Luca Cafiero, Palo Alto, CA (US); Zhiping Yang, Cupertino, CA (US); Victor Odisho, San Jose, CA (US); Francisco Matus, Saratoga, CA (US)

(73) Assignee: Cisco Technology, Inc., San Jose, CA (US)

( * ) Notice: Subject to any disclaimer, the term of this patent is extended or adjusted under 35 U.S.C. 154(b) by 377 days.

(21) Appl. No.: 13/045,972

(22) Filed: Mar. 11, 2011

(65) Prior Publication Data

US 2012/0230700 A1 Sep. 13, 2012

(51) Int. Cl.
*H01R 12/00* (2006.01)

(52) U.S. Cl.
USPC ........................................ 439/76.1; 439/540.1

(58) Field of Classification Search
USPC .............................................. 439/76.1, 541.5
See application file for complete search history.

(56) References Cited

U.S. PATENT DOCUMENTS

| | | | | |
|---|---|---|---|---|
| 5,425,651 | A * | 6/1995 | Thrush et al. ................... | 439/326 |
| 6,203,328 | B1 * | 3/2001 | Ortega et al. .................... | 439/60 |
| 7,070,446 | B2 * | 7/2006 | Henry et al. ................. | 439/541.5 |
| 7,789,674 | B2 * | 9/2010 | Nelson et al. ................ | 439/76.1 |
| 7,798,820 | B2 * | 9/2010 | Hong ........................... | 439/76.1 |
| 7,824,197 | B1 * | 11/2010 | Westman et al. ............. | 439/108 |
| 7,833,068 | B2 * | 11/2010 | Bright et al. ................ | 439/733.1 |
| 8,011,950 | B2 * | 9/2011 | McGrath et al. ............... | 439/497 |
| 8,062,073 | B1 * | 11/2011 | Szczesny et al. .............. | 439/660 |
| 8,167,631 | B2 * | 5/2012 | Ito et al. ......................... | 439/108 |
| 8,267,718 | B2 * | 9/2012 | Straka et al. ................... | 439/497 |
| 8,292,669 | B2 * | 10/2012 | Wang et al. .................... | 439/637 |
| 8,337,243 | B2 * | 12/2012 | Elkhatib et al. ............... | 439/581 |
| 8,342,881 | B2 * | 1/2013 | Lang et al. ............... | 439/607.01 |
| 8,353,707 | B2 * | 1/2013 | Wang et al. ..................... | 439/60 |
| 8,353,728 | B2 * | 1/2013 | Wang et al. .................... | 439/637 |
| 2004/0072467 | A1 * | 4/2004 | Jordan et al. ................... | 439/492 |
| 2005/0164533 | A1 * | 7/2005 | Regnier et al. .................. | 439/79 |
| 2006/0014438 | A1 * | 1/2006 | Regnier ........................ | 439/637 |
| 2007/0232091 | A1 * | 10/2007 | Hong ............................. | 439/66 |
| 2008/0318478 | A1 * | 12/2008 | Nelson et al. ............ | 439/620.01 |
| 2009/0111304 | A1 * | 4/2009 | Hayden et al. ............... | 439/271 |
| 2009/0124128 | A1 * | 5/2009 | Regnier ........................ | 439/630 |
| 2009/0137138 | A1 * | 5/2009 | Ohsumi ........................ | 439/137 |

(Continued)

OTHER PUBLICATIONS

Sumitomo Electric Industries, Ltd., 10Gb/s SFP Optical Transceiver Module, SPP5100LM-GL, Oct. 2010.

*Primary Examiner* — Ross Gushi
(74) *Attorney, Agent, or Firm* — Edell, Shapiro & Finnan, LLC

(57) ABSTRACT

A small form-factor pluggable (SFP) module includes a board with an end portion to be inserted into a connector device. A first set of signal pads is arranged along an edge of a first surface of the SFP board at the end portion and a second set of signal pads along an edge of a second surface of the SFP board at the end portion. A third set of signal pads is disposed on the second surface at the end portion, offset from the edge of the second surface. A transceiver, coupled to the signal pads of the first, second, and third sets of signal pads, is configured to transmit and receive signals via the third set of signal pads and to transmit and receive signals via at least one of the first and second sets of signal pads.

24 Claims, 9 Drawing Sheets

(56) References Cited

U.S. PATENT DOCUMENTS

| | | | |
|---|---|---|---|
| 2009/0311908 A1* | 12/2009 | Fogg et al. | 439/607.05 |
| 2010/0130063 A1* | 5/2010 | Lang et al. | 439/607.17 |
| 2010/0210142 A1* | 8/2010 | McGrath et al. | 439/620.22 |
| 2010/0233910 A1* | 9/2010 | Zhang et al. | 439/626 |
| 2011/0070779 A1* | 3/2011 | Zhang et al. | 439/660 |
| 2011/0195592 A1* | 8/2011 | McGrath et al. | 439/345 |
| 2011/0195593 A1* | 8/2011 | McGrath et al. | 439/345 |
| 2011/0250791 A1* | 10/2011 | Straka et al. | 439/607.09 |
| 2011/0269346 A1* | 11/2011 | Casher et al. | 439/626 |
| 2011/0294347 A1* | 12/2011 | Lang et al. | 439/607.01 |
| 2011/0300757 A1* | 12/2011 | Regnier et al. | 439/626 |
| 2012/0021654 A1* | 1/2012 | Westman et al. | 439/682 |
| 2012/0040560 A1* | 2/2012 | Wang et al. | 439/607.31 |
| 2012/0040563 A1* | 2/2012 | Wang et al. | 439/626 |
| 2012/0040566 A1* | 2/2012 | Wang et al. | 439/660 |
| 2012/0040569 A1* | 2/2012 | Wang et al. | 439/676 |
| 2012/0045942 A1* | 2/2012 | Patel et al. | 439/658 |
| 2012/0129402 A1* | 5/2012 | Wang et al. | 439/629 |
| 2012/0149255 A1* | 6/2012 | Wang et al. | 439/725 |
| 2012/0190218 A1* | 7/2012 | Patel et al. | 439/59 |
| 2012/0190223 A1* | 7/2012 | Wu | 439/152 |
| 2012/0190224 A1* | 7/2012 | Wu | 439/157 |
| 2012/0208405 A1* | 8/2012 | Wang et al. | 439/676 |
| 2012/0230700 A1* | 9/2012 | Cafiero et al. | 398/138 |
| 2012/0322308 A1* | 12/2012 | Fogg et al. | 439/607.25 |
| 2012/0322313 A1* | 12/2012 | Hsu et al. | 439/629 |
| 2012/0329325 A1* | 12/2012 | Fogg et al. | 439/607.25 |
| 2013/0005178 A1* | 1/2013 | Straka et al. | 439/497 |
| 2013/0012038 A1* | 1/2013 | Kirk et al. | 439/55 |
| 2013/0017710 A1* | 1/2013 | Houtz | 439/374 |
| 2013/0017716 A1* | 1/2013 | Elkhatib et al. | 439/502 |
| 2013/0017733 A1* | 1/2013 | Kirk et al. | 439/676 |
| 2013/0034977 A1* | 2/2013 | Cina et al. | 439/92 |
| 2013/0034994 A1* | 2/2013 | Kuang et al. | 439/607.22 |
| 2013/0034998 A1* | 2/2013 | Cina et al. | 439/629 |
| 2013/0065454 A1* | 3/2013 | Milbrand, Jr. | 439/676 |
| 2013/0078870 A1* | 3/2013 | Milbrand, Jr. | 439/676 |
| 2013/0078871 A1* | 3/2013 | Milbrand, Jr. | 439/676 |
| 2013/0084744 A1* | 4/2013 | Zerebilov et al. | 439/607.35 |

* cited by examiner

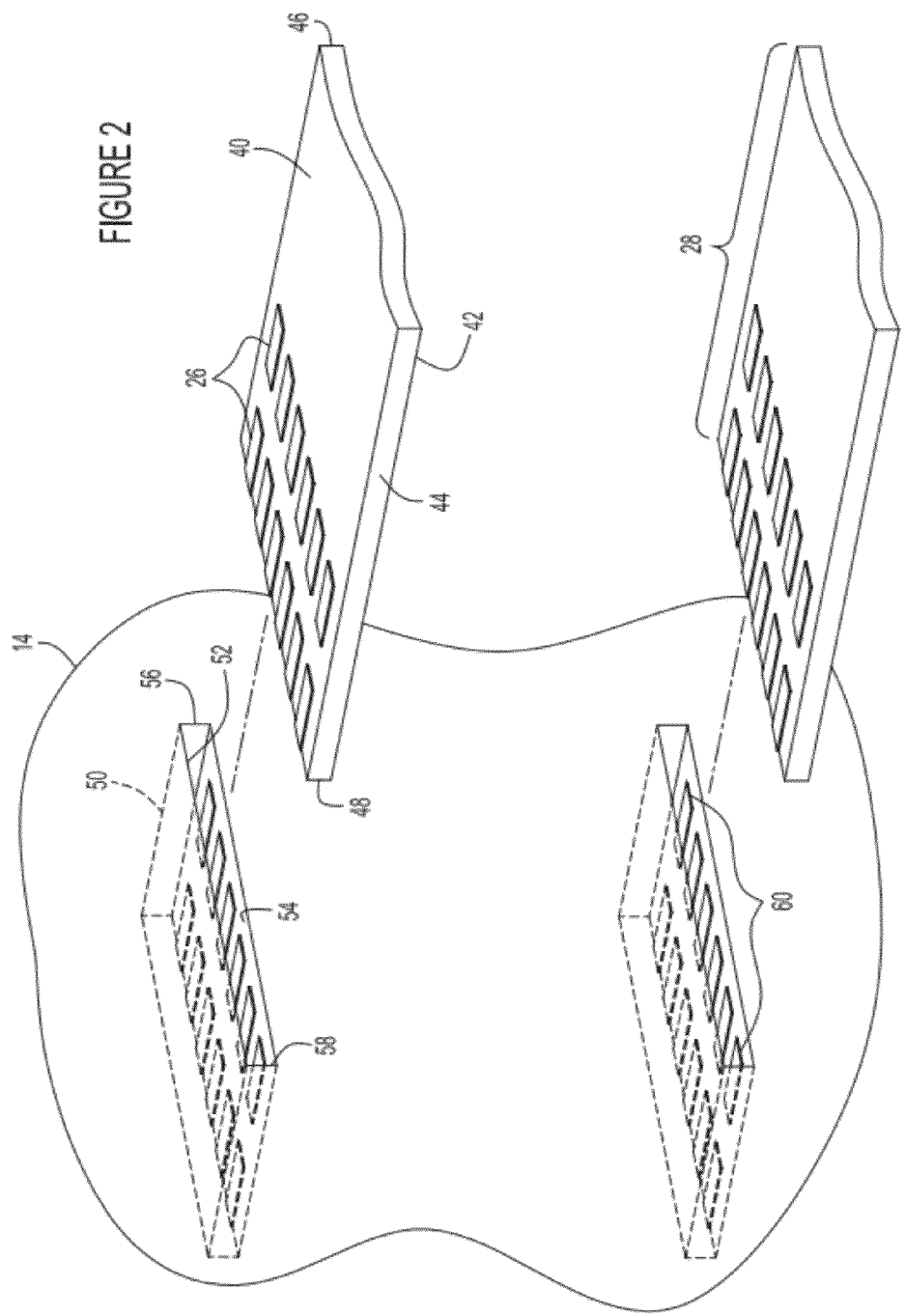

OPTICAL MODULE DESIGN IN AN SFP FORM FACTOR TO SUPPORT INCREASED RATES OF DATA TRANSMISSION

TECHNICAL FIELD

The present invention generally relates to operating a small form-factor pluggable optical transceiver operable at increased rates of data transmission.

BACKGROUND

Small form-factor pluggable (SFP) optical transceivers are pluggable input/output transceivers that can be used for converting electrical signals to optical signals and vice-versa. SFP transceivers are pluggable into sockets of connector devices at host platforms that may be located at endpoints of communication networks. The SFP transceivers can transmit data across communication networks using single mode optical fiber or networking cables over distances from up to several meters to kilometers and can transmit data at a variety of transmission rates. For example, SFP transceivers can support Synchronous Optical Network (SONET), Gigabit Ethernet, Fibre Channel and other communication standards.

The Institute of Electrical and Electronic Engineers (IEEE) sets forth standards for particular rates of data transmission. IEEE 802.3ae describes the 10 Gigabit Ethernet standard (10G) for transmission of data at a nominal rate of 10 Gigabits per second, while IEEE 802.3ba describes data transmission standards at higher data rates, including a 40 Gigabit Ethernet standard (40G) and a 100 Gigabit Ethernet standard (100G) for transmission of data at nominal rates of 40 Gigabits per second and 100 Gigabits per second, respectively.

BRIEF DESCRIPTION OF THE DRAWINGS

FIG. 2 is a perspective view depicting end portions of SFP boards that are configured to be inserted into sockets of an SFP connector device.

DESCRIPTION OF EXAMPLE EMBODIMENTS

Overview

An apparatus is provided comprising a small form-factor pluggable (SFP) board with an end portion configured to be inserted into a connector device. The apparatus has a first set of signal pads disposed along an edge of a first surface of the SFP board at the end portion and a second set of signal pads disposed along an edge of a second surface of the SFP board at the end portion. The apparatus also has at least a third set of signal pads disposed on the second surface of the SFP board at the end portion and offset from the edge of the second surface. A transceiver, coupled to the signal pads of the first, second, and third sets of signal pads, is configured to transmit and receive signals via signal pads of the third set and to transmit and receive signals via signal pads of at least one of the first and second sets.

Example Embodiments

Figure 1:
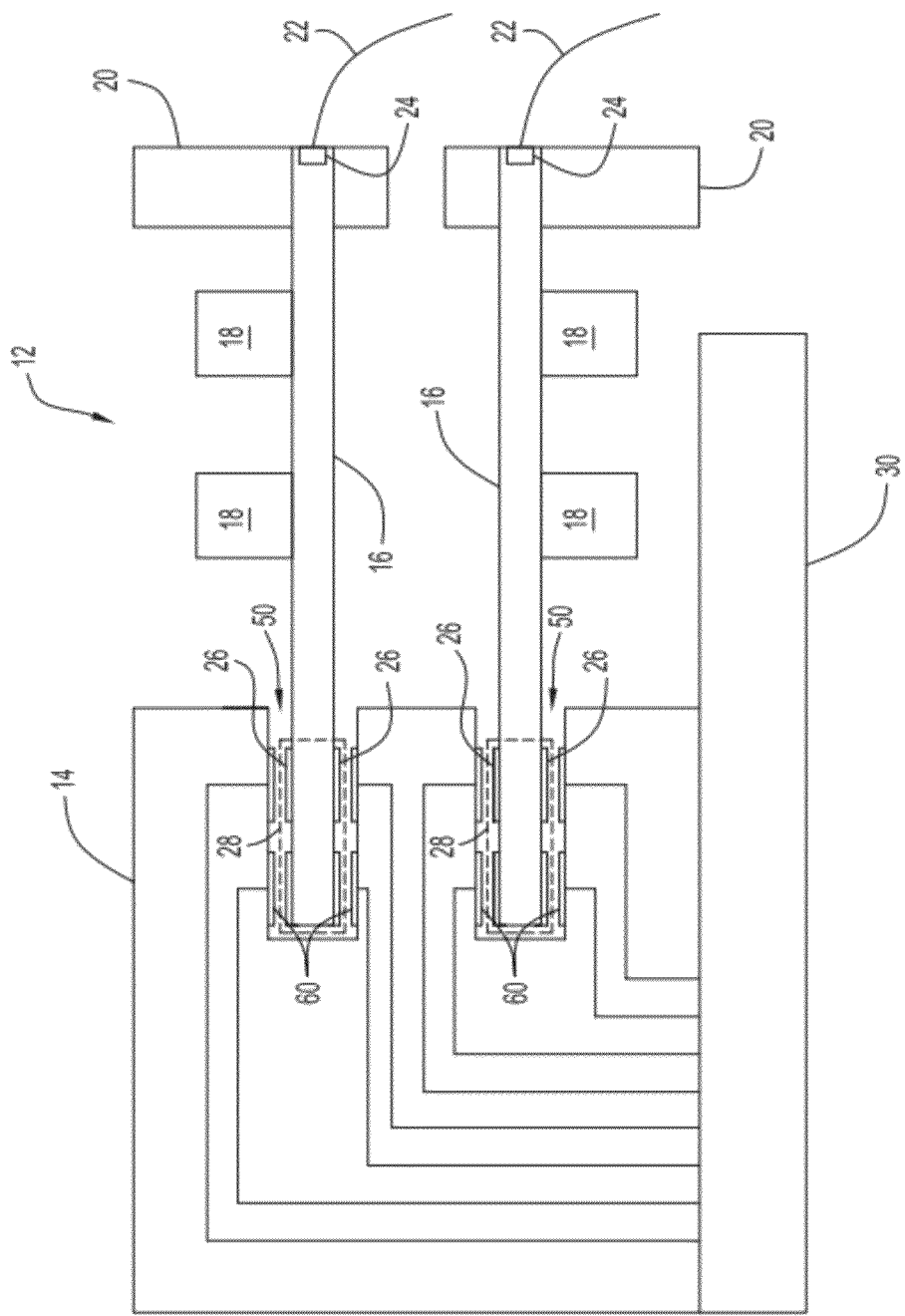
FIG. 1 is conceptual diagram of a plurality of small form-factor pluggable (SFP) modules configured to mate with a connector device.

FIG. 1 shows an assembly including two small form-factor pluggable (SFP) modules 12 that are configured to mate with an SFP connector device 14. The SFP modules 12 can be configured to transmit and receive data at enhanced data rates, for example, according to the techniques described herein. Each of the SFP modules 12 comprises an SFP board 16 populated with circuit devices 18, including one or more transceiver devices or chips.

An end portion 28 of each SFP module 12 is configured to slidably engage a corresponding socket 50 of connector device 14. For clarity, a gap is shown in FIG. 1 between each end portion 28 and its corresponding socket 50. However, in practice, end portions 28 and sockets 50 are suitably dimensioned to provide a press fit that firmly secures each end portion 28 in its socket 50. Connector device 14 is coupled to a system printed circuit board (PCB) 30, which provides an electrical interface between connector device 14 and, for example, a data communications system (not shown). As described in greater detail below, end portion 28 of each SFP module 12 includes signal pads 26 that align with and couple to corresponding contacts 60 within each socket 50. As shown conceptually in FIG. 1, connector 14 includes signal paths extending between socket contacts 60 and system PCB 30 such that SPF modules 12 are electrically coupled to system PCB 30 when inserted into sockets 50.

The opposite end of SFP board 16 of each SFP module 12 includes a release tab 20 and a cable port 24. Release tab 20 can be grasped and pushed or pulled by an operator to insert SFP module 12 into or remove SFP module 12 from connector device 14. Port 24 provides an interface between SFP module 12 and a networking cable (e.g., an optical fiber) 22. The SFP modules 12 are configured to transmit and receive data conveyed over the networking cable 22 through port 24, which may be an optical port configured to interface in accordance with any one of several communication standards. For example, port 24 may be an optical port configured to support Ethernet standards. In another example, port 24 may by a port configured to support an Ethernet cable insertable into port 24. Thus, each SFP module 12 provides an interface between one or more networking cables 22 and a data communications system that manages data communication within a communication network. The SFP modules 12 are configured to transmit and receive data across communication networks according to communication standards. The SFP modules 12 may be, for example, SFP or SFP+ modules that support enhanced data communications across communication networks. As used herein the term "small form-factor pluggable" or "SFP" refers to any of the communication standards within this class of standards.

FIG. 2 shows a perspective view of end portions 28 of SFP boards 16 along with a cutaway of a surface of connector 14 with sockets 50 that are configured to mate with end portions 28. End portion 28 of each SFP board 16 has a substantially planar first surface 40 (e.g., a top surface) and a substantially planar second surface 42 (e.g., a bottom surface) that is substantially parallel with the first surface 40. For simplicity, the first surface 40 is referred to hereinafter as the top surface and the second surface 42 is referred to hereinafter as the bottom surface, though it should be appreciated that the first surface 40 and the second surface 42 may be either the top surface or the bottom surface for each of the end portions 28. The end portions 28 are generally rectangular, with straight, parallel side edge surfaces 44 and 46 extending in a longitudinal direction and adjoining the top and bottom surfaces 40 and 42. Each of the end portions 28 also has an edge surface 48 extending in a traverse direction and adjoining the top and bottom surfaces. The edge surface 48 is substantially perpendicular to the side edge surfaces 44 and 46 and the top and bottom surfaces 40 and 42. Sets of signal pads 26 are disposed along the top surface 40 of each of the end portions 28 of the SFP boards 16. Additionally, though not shown in FIG. 2, sets of signal pads 26 are also disposed along the bottom surface 42 of each of the end portions 28.

The end portions 28 of the SFP boards 16 are each configured to be slidably inserted into corresponding sockets 50 located on the connector device 14. For example, the end portions 28 of the SFP boards 16 may be pressed into corresponding sockets 50 to initiate a pressure fit between the end portions 28 and corresponding sockets 50. The sockets 50 may be arranged in a stacked configuration such that the sockets 50 are offset from each other in a vertical direction that is perpendicular to the top surface 40 and the bottom surface 42.

Each of the sockets 50 is configured as a cavity having a substantially rectangular transverse cross section with width and height dimensions that are slightly greater than the width and thickness of end portion 28 of SFP board 12. The interior of each socket 50 comprises a first inner socket surface 52 (e.g., a top socket surface) that is substantially rectangular in shape and a second inner socket surface 54 (e.g., a bottom socket surface) that is substantially parallel to and opposes the first inner socket surface 52 and that is also substantially rectangular in shape. The interior of each socket 50 also includes side surfaces 56 and 58 adjoining the top and bottom socket surfaces 52 and 54. In general, surfaces 52, 54, 56 and 58 form a substantially rectangular prism housing that is configured to house end portion 28 of the SFP board 16.

Sets of contacts 60 are disposed along the bottom socket surface 54 in each of the sockets 50. Additionally, though not shown in FIG. 2, sets of contacts 60 are also disposed along the top socket surface 52 in each of the sockets 50. The contacts 60 are electrically coupled to the system PCB 30 shown in FIG. 1.

Each end portion 28 of the SFP boards 16 is configured to be inserted into a corresponding socket 50 (i.e., to mate with socket 50) along the longitudinal direction such that the housing of the corresponding socket 50 receives the end portion 28. When an end portion 28 mates with a socket 50, the sets of contacts 60 of the socket 50 are arranged to align with and engage the sets of signal pads 26 of the SFP board 16. For example, the sets of contacts 60 that are located on the top socket surface 52 of the socket 50 are configured to engage the sets of signal pads 26 disposed on the top surface 40 of the end portion 28. Similarly, contacts 60 that are located on the bottom socket surface 54 of the socket 50 are configured to engage the sets of signal pads 26 disposed on the bottom surface 42 of the end portion 28. Thus, the end portion 28 mates with the corresponding socket 50 when the contacts 60 engage the signal pads 26.

Figure 3A:
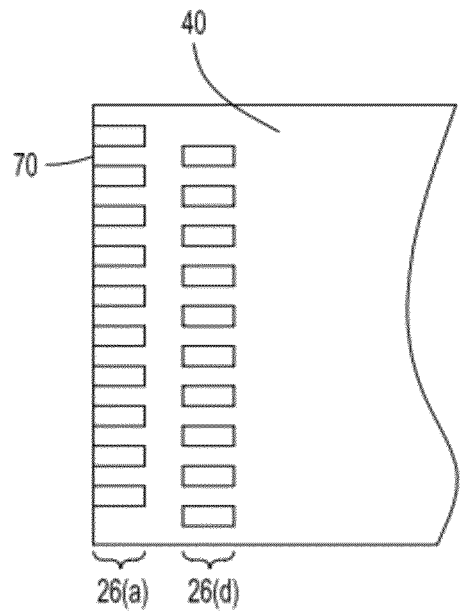
FIGS. 3A and 3B are plan views respectively depicting top and bottom surfaces of an end portion of an SFP module having multiple sets of signal pads.
Figure 3B:
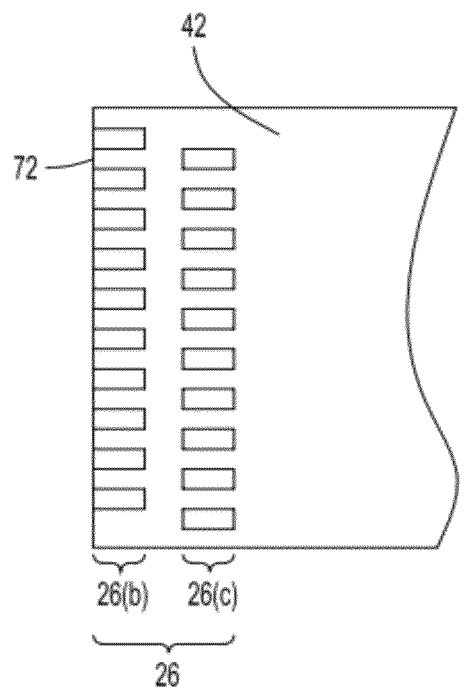

Reference is now made to FIGS. 3A and 3B. FIGS. 3A and 3B are plan views depicting top and bottom surfaces 40 and 42, respectively, of an end portion 28 of an SFP board 16. FIGS. 3A and 3B show sets of signal pads 26 disposed on the top and bottom surfaces 40 and 42, respectively. The signal pads 26 on the top and bottom surfaces may be arranged in separate row sets, as indicated by reference numerals 26(a)-(d). For example, a first set of signal pads, shown at 26(a) in FIG. 3A, may be disposed along an edge 70 of the top surface 40, and a second set of signal pads, shown at 26(b) in FIG. 3B, may be disposed along the edge 72 of the bottom surface 42.

A third set of signal pads, shown at 26(c) in FIG. 3B, may be added to the bottom surface 42 such that the third set 26(c) of signal pads is offset in a longitudinal direction from the second set 26(b) and the edge 72 of the bottom surface 42. The third set 26(c) of signal pads may also be offset from the second set 26(b) in a traverse direction, as shown. Specifically, individual signal pads of the third set 26(c) are offset in the transverse direction from individual signal pads of the second set 26(b) such that the signal pads of the two sets are not aligned in the transverse direction and lie on different lines in the longitudinal direction.

Optionally, a fourth set of signal pads, shown at 26(d) in FIG. 3A, may be added to the top surface 40 such that the fourth set 26(d) of signal pads are offset in a longitudinal direction from the first set 26(a) and the edge 70 of the top surface 40. The fourth set 26(d) of signal pads may also be offset from the first set 26(a) in a traverse direction. Though the sets of signal pads 26 in FIGS. 3A and 3B are shown as row sets 26(a)-(d), it should be appreciated that the signal pads 26 may be arranged in any set configurations along the top surface 40 and the bottom surface 42.

In general, one or more of the signal pads of an SFP module 12 may be designated to transmit or receive a particular signal type, and performance characteristics of the SFP module 12 can change based on how the signal pads are designated. For example, as described herein, designation of certain pairs of signal pads as differential pair signal pads can increase the rate of data transmission and reception by the transceiver unit 18 of the SFP module 12 relative to a base configuration involving only one set of signal pads on each face of the SFP module 12. Since the transceiver unit (represented by one or more board-mounted devices 18) of the SFP module 12 is configured to transmit and receive signals, certain signal pads of the SFP module 12 may be assigned for particular transmitter signals while other signal pads of the SFP module 12 may be assigned for particular receiver signals. Examples of signal assignment configurations are provided in FIGS. 4A and 4B and FIGS. 5A and 5B, which are described below. It should be appreciated that FIGS. 4A and 4B and FIGS. 5A and 5B represent example configurations for the signal pad assignment and that the signal pads may be assigned in other configurations.

Figure 4A:
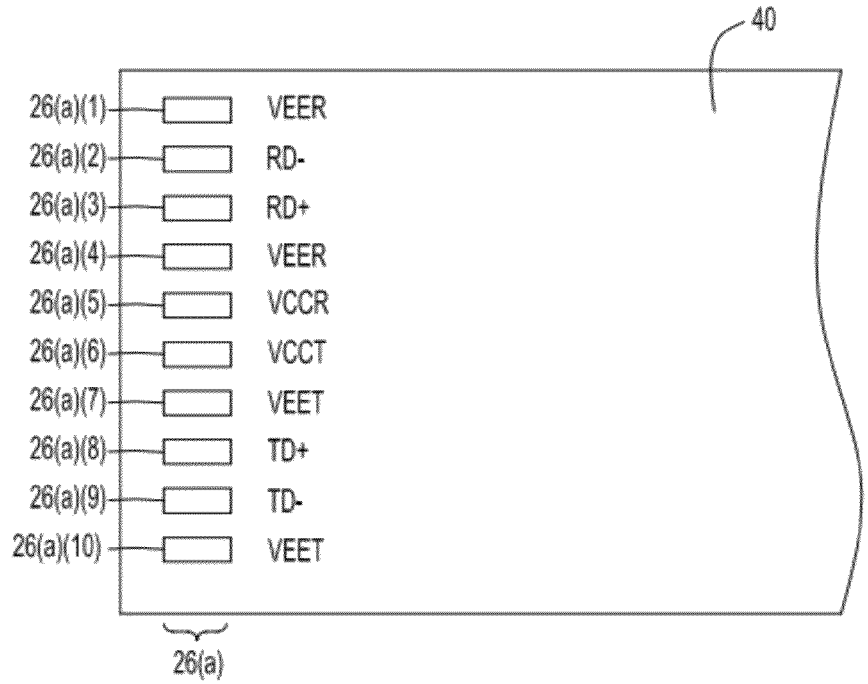
FIGS. 4A and 4B are diagrams depicting a first example configuration and signal assignments of signal pads on top and bottom surfaces of an SFP module.
Figure 4B:
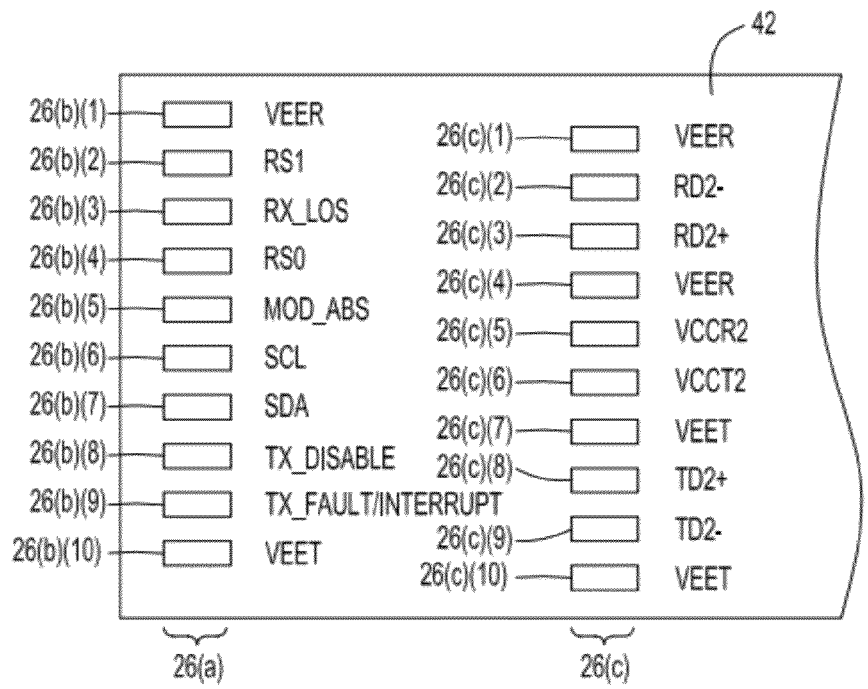

FIGS. 4A and 4B depict a first example signal assignment configuration of signal pads disposed on the end portions 28 along the top surface 40 and the bottom surface 42 of the SFP board 16. In this example, only three sets of signal pads are present, with one set of signal pads on the top face 40 and two sets of signal pads on the bottom face 42. In particular, FIG. 4A shows a first set of signal pads 26(a) disposed along edge 70 of the top surface 40, and FIG. 4B shows a second set of signal pads 26(b) disposed along edge 72 of the bottom surface 42. FIG. 4B also shows a third set of signal pads 26(c) disposed on the bottom surface 42 and offset from the second set 26(b) and the edge 72 in a longitudinal and traverse direction as described above in FIG. 3B.

In FIGS. 4A and 4B, each row set 26(a)-(c) has ten signal pads that are assigned to particular signal types, including transmitter signals and receiver signals, though it should be appreciated that each row set 26(a)-(c) may have any number of signal pads assigned to any signal type. The particular signal types for each of the signal pads in sets 26(a)-(c) are shown in Table 1, below, together with FIGS. 4A and 4B such that one of ordinary skill in the art will understand the signal pad assignment.

TABLE 1

Description of signal pad assignment

| Signal pad assignment | Description |
| --- | --- |
| Veer | Module Receiver Ground |
| RS1 | Rate Select 1 |
| RX_LOS | Receiver Loss of Signal Indication |
| RS0 | Rate Select 0 |
| MOD_ABS | Module Absent |
| SCL | 2 Wire Serial Interface Data Line |
| SDA | 2 Wire Serial Interface Data Line |
| TX_Disable | Transmitter Disable, Turns off transmitter laser output |
| TX_Fault/ Interrupt | Module Transmitter Fault/Interrupt |
| Veet | Module transmitter ground |
| RD− | First Receiver Inverted Differential Data Output |
| RD+ | First Receiver Non-Inverted Differential Data Output |
| RD2− | Second Receiver Inverted Differential Data Output |
| RD2+ | Second Receiver Non-Inverted Differential Data Output |
| Vccr | Module First Receiver Power Supply |
| Vccr2 | Module Second Receiver Power Supply |
| Vcct | Module First Transmitter Power Supply |
| Vcct2 | Module Second Transmitter Power Supply |
| TD− | First Transmitter Inverted Differential Data Input |
| TD+ | First Transmitter Non-Inverted Differential Data Input |
| TD2− | Second Transmitter Inverted Differential Data Input |
| TD2+ | Second Transmitter Non-Inverted Differential Data Input |
| RD3− | Third Receiver Inverted Differential Data Output |
| RD3+ | Third Receiver Non-Inverted Differential Data Output |
| RD4− | Fourth Receiver Inverted Differential Data Output |
| RD4+ | Fourth Receiver Non-Inverted Differential Data Output |
| TD3− | Third Transmitter Inverted Differential Data Input |
| TD3+ | Third Transmitter Non-Inverted Differential Data Input |
| TD4− | Fourth Transmitter Inverted Differential Data Input |
| TD4+ | Fourth Transmitter Non-Inverted Differential Data Input |

As shown in Table 1 above, some signal pad assignments may be for transmitter operations of the transceiver unit 18 while others may be for receiver operations of the transceiver unit 18. For example, the "Vccr" and "Vccr2" pad designations (assigned to signal pads 26(a)(5) and 26(c)(5), respectively, in FIGS. 4A and 4B) serve as first and second receiver power supply pads for the SFP module 12, while the "Vcct" and "Vcct 2" pad designation (assigned to signal pads 26(a)(6) and 26(c)(6), respectively, in FIGS. 4A and 4B) serve as a first and second transmitter power supply pads for the SFP module 12.

As also shown in Table 1 and FIGS. 4A and 4B, certain pairs of signal pads are assigned to operate as transmitter and receiver differential signal pair pads, which influence the rate of data reception and transmission of the SFP module 12. For example, signal pads 26(a)(2) and 26(a)(3) on the top surface 40 and 26(c)(2) and 26(c)(3) on the bottom surface 42 are assigned as first and second receiver differential pair pads, respectively, for inverted and non-inverted receiver differential data output. Similarly, signal pads 26(a)(8) and 26(a)(9) on the top surface 40 and 26(c)(8) and 26(c)(9) on the bottom surface 42 are assigned as first and second transmitter differential pair pads, respectively, for inverted and non-inverted transmitter differential data input.

Each of the differential pair pads allows for the transceiver units 18 of the SFP module 12 to operate at a particular rate for data reception and transmission. For example, since signal pads 26(a)(2) and 26(a)(3) operate as a receiver differential pair, these signal pads may allow the transceiver units 18 of the SFP module 12 to operate at a 20 Gigabit per second data rate for data reception. Since signal pads 26(c)(2) and 26(c)(3) operate as a second receiver differential pair, these signal pads may also allow the transceiver units 18 of the SFP module 12 to operate at an additional 20 Gigabit per second data rate for data reception. Thus, the differential signal pairs 26(a)(2)-26(a)(3) and 26(c)(2)-26(c)(3) allow the transceiver units 18 of the SFP module 12 to operate at a 40 Gigabit per second rate for data reception over these differential signal pair pads.

Similarly, since signal pads 26(a)(8) and 26(a)(9) operate as a transmitter differential pair, these signal pads may allow for the transceiver units 18 of the SFP module 12 to operate at, for example, a 20 Gigabit per second data rate for data transmission. Since signal pads 26(c)(8) and 26(c)(9) operate as a second transmitter differential pair, these signal pads may also allow the transceiver units 18 to operate at an additional 20 Gigabit per second rate for data transmission. Thus, the differential signal pairs 26(a)(8)-26(a)(9) and 26(c)(8)-26(c)(9) allow the transceiver units 18 to operate at a 40 Gigabit per second rate of data transmission over these differential signal pair pads.

In this example, the transceiver units 18 of the SFP module 12 are able to operate in a bi-directional mode (i.e., for data reception and transmission), enabling the transceiver units 18 to receive and transmit data at a 40 Gigabit per second data transmission rate. Specifically, when an SFP module 12 has two transceiver units 18 (as in FIG. 1), each of the transceiver units 18 may be configured to receive 20 Gigabit electrical signals for data reception (e.g., by receiving two 10 Gigabit electrical signals) from one or more of the receiver differential signal pairs and 20 Gigabit electrical signals for data transmission (e.g., by receiving two 10 Gigabit electrical signals) from one or more of the transmitter differential signal pairs. Each transceiver unit 18 can then perform an optical conversion to convert the 20 Gigabit electrical signals for data reception and transmission to corresponding optical signals for data reception and transmission, thus enabling each of the two transceiver units 18 to receive and transmit optical data at a 20 Gigabit per second data transmission rate. As a result, the SFP module 12 is able to operate in compliance with 40 Gigabit Ethernet standards. Additionally, the example signal pad configuration in FIGS. 4A and 4B allow the SFP module 12 to be backwards compatible with an SFP module that is configured to operate at a 10 Gigabit per second rate of data transmission.

Thus, since the third set 26(c) of signal pads contains transmitter and receiver differential signal pair pads, transmitting and receiving signals, in particular differential signals, via the third set 26(c) of signal pads 26 allows for the transceiver unit 18 of the SFP module 12 to operate at a data rate that is higher than a data rate achievable by transmitting and receiving signals via only the first set 26(a) or second set 26(b), or any combination of the two, while maintaining backwards compatibility with SFP modules operating at lower data rates.

Figure 5A:
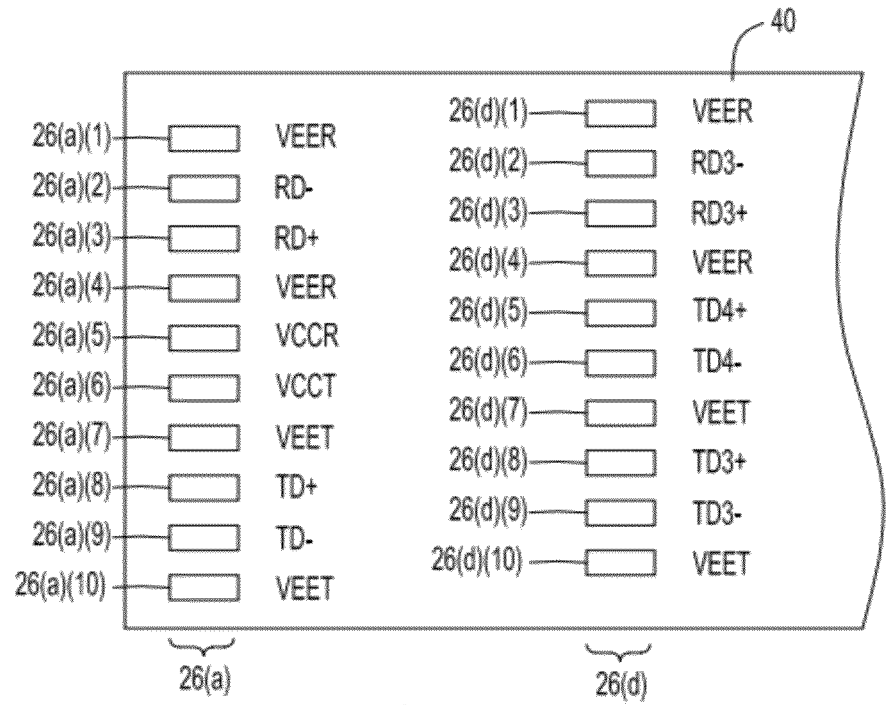
FIGS. 5A and 5B are diagrams depicting a second example configuration and signal assignments of signal pads on top and bottom surfaces of an SFP module.
Figure 5B:
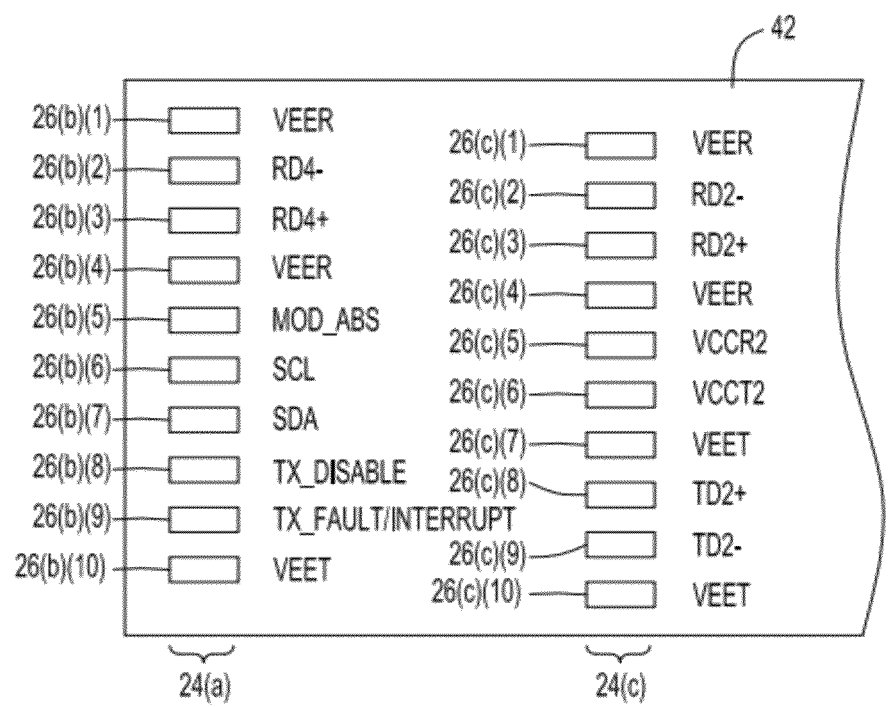

Reference is now made to FIGS. 5A and 5B. FIGS. 5A and 5B depict a second example signal assignment configuration of signal pads disposed on the end portion 28 along the top surface 40 and the bottom surface 42 of the SFP board 16.

FIG. 5A shows a first set of signal pads 26(*a*) disposed on the top surface 40 along edge 70, and FIG. 5B shows a second set of signal pads 26(*b*) disposed on the bottom surface 42 along edge 72. FIG. 5B also shows a third set of signal pads 26(*c*) disposed on the bottom surface 42 and offset from the edge 72 and second set 26(*a*) in a longitudinal and traverse direction, as described above for FIG. 3B. FIG. 5A shows a fourth set of signal pads 26(*d*) disposed on the top surface 40 and offset from the edge 70 and first set 26(*a*) in a longitudinal and traverse direction, as described in FIG. 3A above.

Similar to FIGS. 4A and 4B, each row set 26(*a*)-(*d*) of signal pads in FIGS. 5A and 5B has ten signal pads that are assigned to particular signal types, including transmitter signals and receiver signals, though it should be appreciated that each row set 26(*a*)-(*d*) may have any number of signal pads assigned to any signal type. Particular signal types for each of the signal pads in sets 26(*a*)-(*d*) are shown in FIGS. 5A and 5B together with Table 1, above.

As in FIGS. 4A and 4B, above, certain pairs of signal pads in FIGS. 5A and 5B are assigned to operate as transmitter and receiver differential signal pair pads, which influence the rate of data reception and transmission of the SFP module 12. FIGS. 5A and 5B show four signal pair pads assigned for inverted and non-inverted receiver differential data output (i.e., 26(*a*)(2) and 26(*a*)(3), 26(*c*)(2) and 26(*c*)(3), 26(*d*)(2) and 26(*d*)(3), and 26(*b*)(2) and 26(*b*)(3)) and four signal pair pads assigned for inverted and non-inverted transmitter differential data input (i.e., 26(*a*)(8) and 26(*a*)(9), 26(*c*)(8) and 26(*c*)(9), 26(*d*)(8) and 26(*d*)(9), and 26(*d*)(5) and 26(*d*)(6)). Each of the differential pair pads allows for the transceiver units 18 of the SFP module 12 to operate at a particular rate for data reception and transmission. For example, each of the four receiver differential pair pads may allow the transceiver units 18 to operate at a 25 Gigabit per second data rate for data reception. Similarly, each of the four transmitter differential pair pads may allow the transceiver units 18 to operate at a 25 Gigabit per second data rate for data transmission.

Thus, in this example, the transceiver units 18 of the SFP module 12 are able to operate in a bi-directional mode at a 100 Gigabit per second rate of data reception and a 100 Gigabit per second rate of data transmission. Specifically, when an SFP module 12 has four transceiver units, each of the transceiver units may be configured to receive 25 Gigabit electrical signals for data reception from one or more of the receiver differential signal pairs and 25 Gigabit electrical signals for data transmission from one or more of the transmitter differential signal pairs. Each transceiver unit can then perform an optical conversion to convert the 25 Gigabit electrical signals for data reception and transmission to corresponding optical signals for data reception and transmission, thus enabling each of the four transceiver units to receive and transmit optical data at a 25 Gigabit per second data transmission rate. Similarly, when an SFP module 12 has two transceiver units (as shown in FIG. 1), each of the transceiver units may be configured to receive 50 Gigabit electrical signals for data reception (e.g., two 25 Gigabit electrical signals) from one or more of the receiver differential pairs and 50 Gigabit electrical signals for data transmission (e.g., two 25 Gigabit electrical signals) from one or more of the transmitter differential pairs. Each transceiver unit can then optically convert the 50 Gigabit electrical signals for data reception and transmission to corresponding optical signals, thus enabling each of the two transceiver units to receive and transmit optical data at a 50 Gigabit per second data transmission rate. As a result, the SFP module 12 is able to operate in compliance with 100 Gigabit Ethernet standards. Additionally, the example signal pad configuration in FIGS. 5A and 5B allow the SFP module 12 to be backwards compatible with an SFP module that is configured to operate at a 40 Gigabit per second rate of data transmission.

Thus, since the fourth set 26(*d*) of signal pads contains transmitter and receiver differential signal pair pads, transmitting and receiving signals, in particular differential signals, via the fourth set 26(*d*) of signal pads 26 allows for the transceiver unit 18 of the SFP module 12 to operate at a data rate that is higher than a data rate achievable by transmitting and receiving signals via only the first set 26(*a*), second set 26(*b*) or third set 26(*c*), or any combination of the three, while maintaining backwards compatibility with SFP modules operating at lower data rates.

Figure 6:
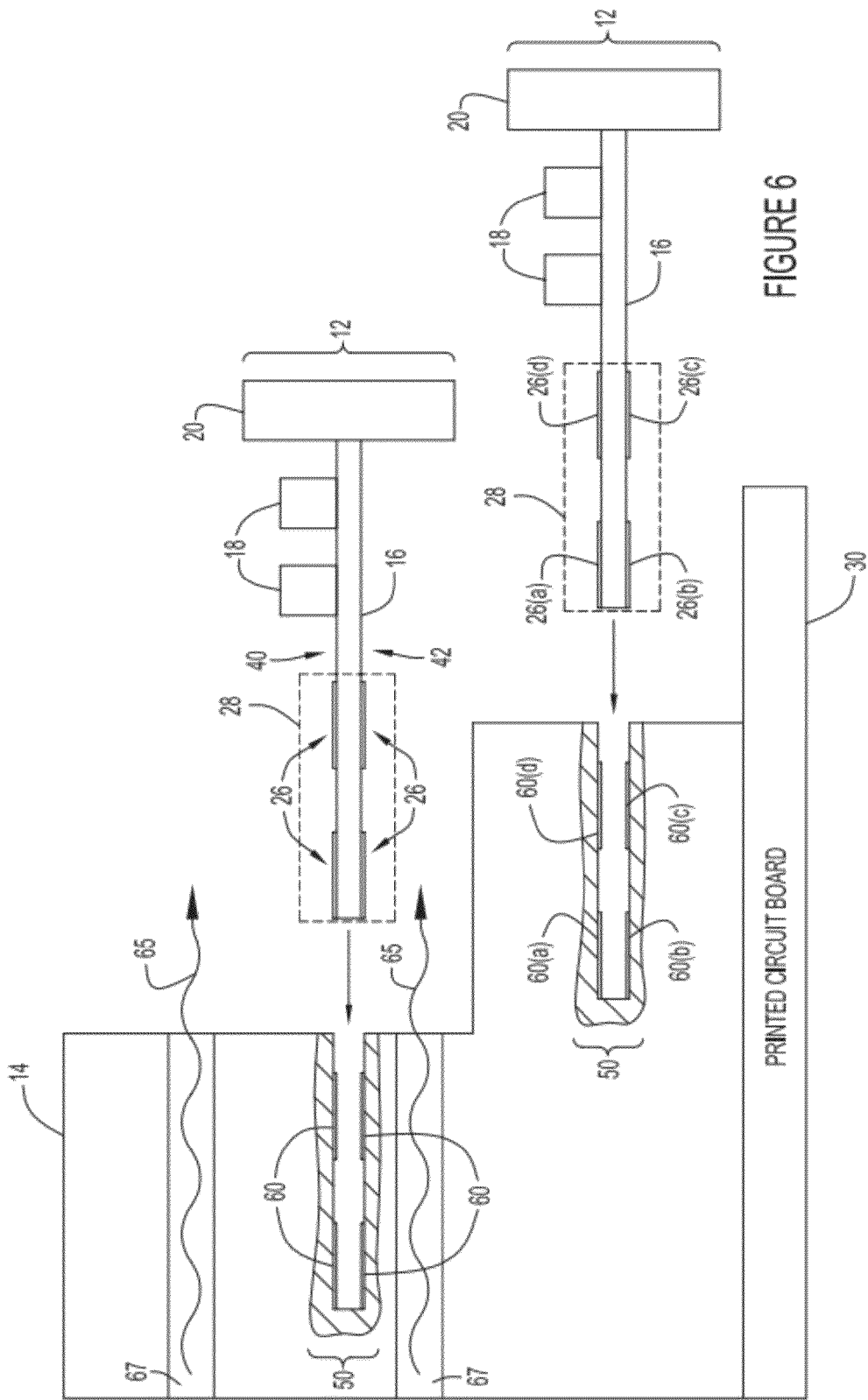
FIG. 6 is a conceptual diagram depicting multiple SFP modules configured to be inserted into sockets of an SFP connector device such that the SFP modules are offset from each other.

Reference is now made to FIG. 6. FIG. 6 shows a conceptual diagram depicting two SFP modules 12, the end portions 28 of which are configured to mate with offset sockets 50 of an SFP connector device 14. The two SFP modules in FIG. 6 are oriented in an "up-up" position, such that signal pads 26 disposed on the top surface 40 of each SFP module 12 is configured to engage the top socket surface 52 of each corresponding socket 50. The two sockets 50 of the connector device apparatus 14 shown in FIG. 6 are arranged in a stacked configuration such that the sockets 50 are offset in a vertical direction (i.e., a direction perpendicular to the top surface 40 of the SFP module) and in a longitudinal direction (described above). As a result, openings for each of the sockets 50 are vertically and longitudinally offset from each other. In one example, the sockets 50 are longitudinally offset from each other by about 8 to 10 millimeters.

As shown in FIG. 6, end portions 28 of the SFP modules 12 are configured to be slidably inserted into the housing of a corresponding socket 50. Each of the sockets 50 has a first (e.g., top) socket surface 52 configured to engage the top surface 40 of the end portion 28 and a second (e.g., bottom) socket surface 54 configured to engage the bottom surface 42 of the end portion 28. The sockets 50 have contacts 60 configured to engage the signal pads 26 of the end portions 28. For example, each of the sockets 50 has first, second, third and fourth sets of contacts (shown at reference numerals 60(*a*)-60(*d*), respectively) configured to engage the corresponding first, second, third and fourth sets of signal pads (shown at reference numerals 26(*a*)-26(*d*)) of the end portions 28. In one example, the first and fourth sets of contacts are disposed along the top socket surface 52, and the second and third sets of contacts are disposed along the bottom socket surface 54. The sets of contacts 60(*a*)-60(*d*) in FIG. 6 may be arranged as a row contacts, though it should be appreciated that these contacts may be arranged in any set configurations along the top socket surface 52 and the bottom socket surface 54.

When the SFP modules 12 mate with a corresponding sockets 50, air, or any cooling substance, can be pushed through the connector device 14 in order to cool the SFP modules 12. Air flow may be effective in cooling an SFP module that are oriented, for example, in an "up" position (i.e., such that the top surface 40 engages the top socket surface 52). In FIG. 6, arrows 65 indicate air flowing through passages 67 in the connector device 14. Since the SFP modules 12 are oriented in an "up-up" position, the air flow, indicated by arrows 65, can effectively cool each of the SFP modules.

Additionally, when the SFP modules 12 mate with a corresponding socket 50, the SFP modules 12 are vertically and longitudinally offset from one another by virtue of mating with the vertically and longitudinally offset sockets 50. Thus, since the SFP modules 12 are longitudinally offset, the release tabs 20 of each SFP module 12 are also longitudinally offset and do not interfere with each other. Accordingly, each release tab 20 can be easily accessed and engaged (e.g., pulled longitudinally away from the connector device 14) to separate each SFP module from its corresponding socket 50.

Figure 7:
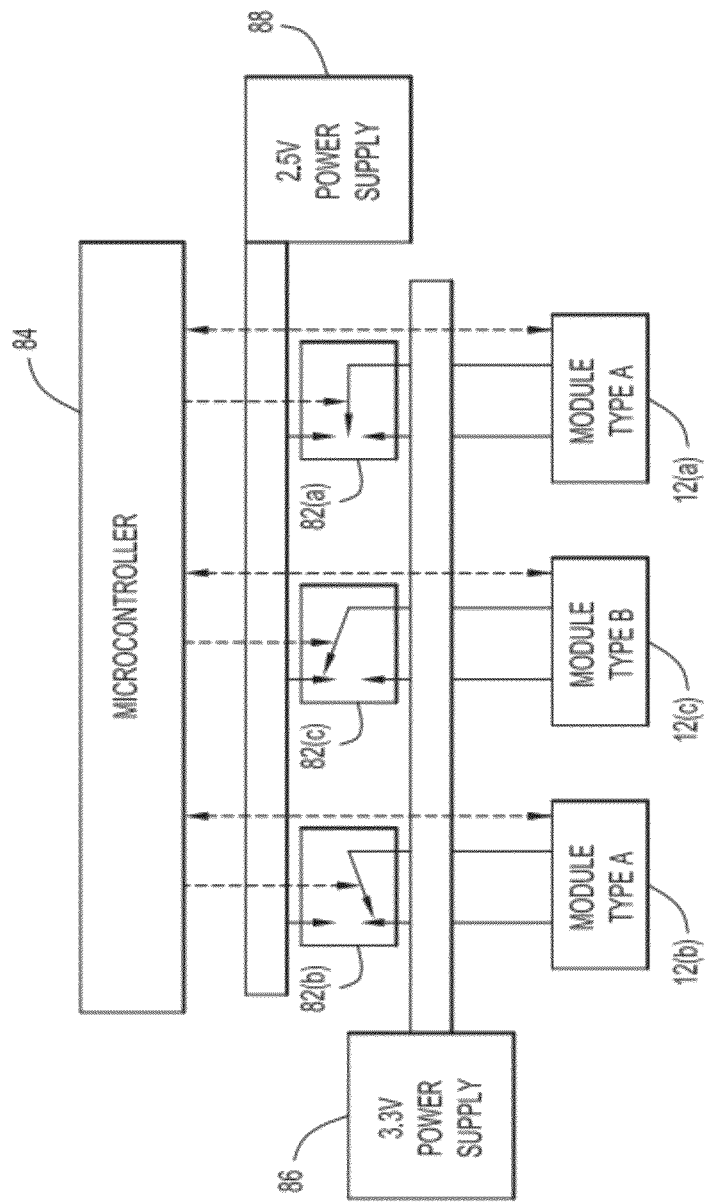
FIG. 7 is a conceptual diagram depicting first and second power supplies configured to respectively supply first and second power signals to the SFP module and a switch device configured to select the power supply that delivers power to the SFP module.

Reference is now made to FIG. 7. FIG. 7 shows a diagram depicting two power supplies configured to deliver power to three SFP modules (shown at reference numeral 12(*a*)-(*c*)). SFP module 12(*a*) and SFP module 12(*b*) is a Module Type A, while SFP module 12(*c*) is a Module Type B. The SFP modules 12(*a*)-(*c*) are coupled to corresponding switch devices 82(*a*)-(*c*) and a microcontroller 84. Likewise, the switch devices 82(*a*)-(*c*) are coupled to the microcontroller 84 and to the first power supply 86 and the second power supply 88.

In general, the microcontroller 84 classifies the supply voltage requirements for each of the SFP modules 12(*a*)-(*c*) and directs each of the switch devices 82(*a*)-(*c*) to couple the corresponding SFP modules to an appropriate power supply based on board configurations of the SFP modules. In one example, the first power supply 86 always supplies a first voltage to each SFP module 12(*a*)-(*c*) via a first power signal pad (for example, via "Vccr" or "Vcct" signal pad, described above) of each SFP board. Subsequently, the microcontroller 84 interrogates each SFP module 12(*a*)-(*c*) to determine the module type. For example, the microcontroller 84 may evaluate a board configuration (for example, by evaluating Electrically Erasable Programmable Read Only Memory (EE-PROM) content of each SFP module) of each module to determine the module type, and accordingly, will direct the switch devices 82(*a*)-(*c*) to couple, if necessary, a second power signal pad (for example, via "Vccr2" or "Vcct2" signal pad, described above) of each SFP board to either the first power supply 86 or a different second power supply 88 based on the board configuration and EEPROM content of each SFP module. For example, microcontroller 84 is shown as interrogating SFP module 12(*a*) to determine how to instruct switch device 82(*a*). If microcontroller 84 determines that the module is of one of a first module type, as shown by 12(*b*), then microcontroller 84 will instruct switch 82(*b*) to couple the first power supply 86 to the module. If microcontroller 84 determines that the module is one of a second module type, as shown by 12(*c*), then the microcontroller 84 will instruct switch 82(*c*) to couple the second power supply 88 to the module. Thus, at the first signal pad, each SFP module 12(*a*)-(*c*) receives the first voltage from first power supply 86, and at the second signal pad, each SFP module receives either the first voltage from the first power supply 86, a second voltage from a second power supply 88, or neither the first voltage nor the second voltage.

Thus, in FIG. 7, SFP module 12(*a*) receives the first voltage from the first power supply 86 at the first power signal pad and receives neither a first nor a second voltage at the second power signal pad of its SFP board. In one example, SFP module 12(*a*) may represent an undecided switch state for the SFP module 12(*a*) before the microcontroller 84 directs switch 82(*a*) to couple module 12(*a*) to the first power supply 86. SFP module 12(*b*) receives a first voltage (e.g., 3.3 volts) from the first power supply 86 at both the first power signal pad and the second power signal pad. SFP module 12(*c*) receives the first voltage from the first power supply 86 at the first power signal pad and receives a second voltage (e.g., 2.5 volts) from the second power supply 88 at the second power signal pad of its SFP board. It should also be appreciated that, though the first power supply 86 is shown to supply 3.3 volts and the second power supply 88 is shown to supply 2.5 volts, the first and second power supply can generally supply any voltage amount to the SFP modules.

Figure 8:
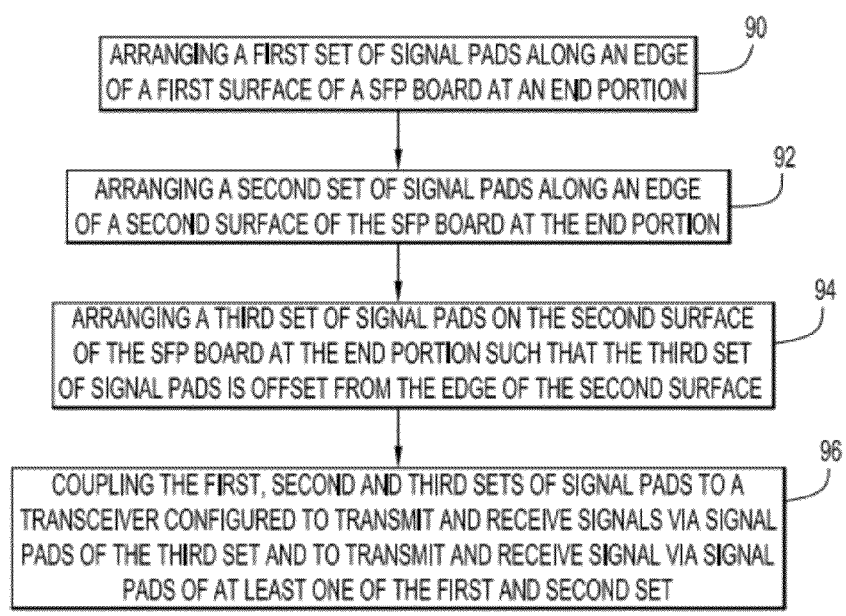
FIG. 8 is a flow chart depicting a process for providing multiple sets of signal pads on the SFP module.

Turning to FIG. 8, a flow chart depicting a process for providing multiple sets of signal pads on an SFP module is shown. At step 90, a first set of signal pads is arranged along an edge of a first surface of an end portion of an SFP board. At step 92, a second set of signal pads is arranged along an edge of a second surface of the SFP board at the end portion. At step 94, a third set of signal pads is arranged on the second surface of the SFP board at the end portion such that the third set of signal pads is offset from the edge of the second surface. At step 96, the first, second and third sets of signal pads are coupled to a transceiver configured to transmit and receive signals via signal pads of the third set and to transmit and receive signals via signal pads of at least one of the first and second set.

Figure 9:
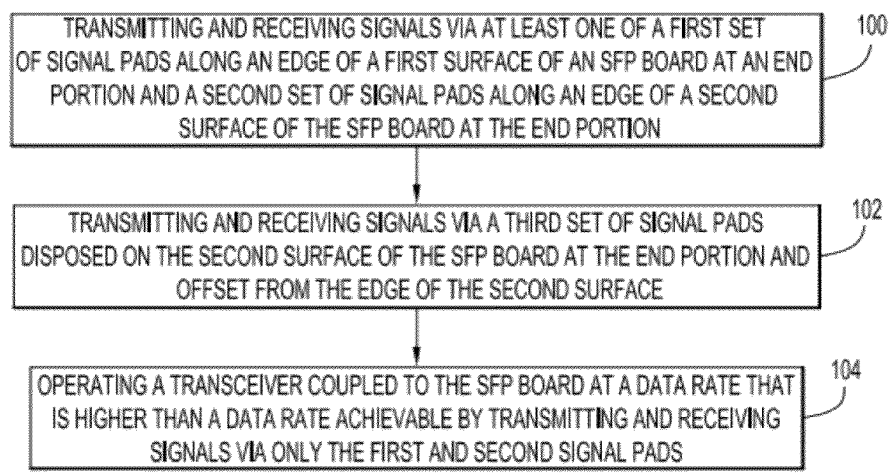
FIG. 9 is a flow chart depicting a process for operating the SFP module at higher rates of data transmission.

Turning now to FIG. 9, a flow chart depicting a process for operating the SFP transceiver at higher rates of data transmission is shown. At step 100, signals are transmitted and received via at least one of a first set of signal pads along an edge of a first surface of an SFP board at an end portion and a second set of signal pads along an edge of a second surface of the SFP board at the end portion. At step 102, signals are transmitted and received via a third set of signal pads disposed on the second surface of the SFP board at the end portion and offset from the edge of the second surface. At step 104, a transceiver coupled to the SFP board is operated at a data rate that is higher than a data rate achievable by transmitting and receiving signals via only the first and second signal pads.

In sum, an apparatus is provided comprising: a small form-factor pluggable (SFP) board with an end portion configured to be inserted into a connector device, a first set of signal pads disposed along an edge of a first surface of the SFP board at the end portion, a second set of signal pads disposed along an edge of a second surface of the SFP board at the end portion, a third set of signal pads disposed on the second surface of the SFP board at the end portion and offset from the edge of the second surface, and a transceiver coupled to signal pads of the first, second, and third sets of signal pads and configured to transmit and receive signals via signal pads of the third set and to transmit and receive signals via signal pads of at least one of the first and second sets.

Additionally, an apparatus is provided comprising: a connector device with stacked sockets configured to engage small form-factor pluggable (SFP) boards, each socket having a first socket surface configured to engage a first surface of SFP board and a second socket surface configured to engage a second surface of the SFP board. Each of the stacked sockets comprises: a first set of contacts disposed along the first socket surface that are configured to engage a first set of signal pads of the SFP board, a second set of contacts disposed along the second socket surface that are configured to engage a second set of signal pads of the SFP board, and a third set of contacts disposed along the second socket surface configured to engage a third set of signal pads of the SFP board. The first socket surface and the second socket surface are aligned along a first plane that is parallel to the first surface and second surface of the SFP board.

Furthermore, a method is provided comprising: arranging a first set of signal pads along an edge of a first surface of a small form-factor pluggable (SFP) board at an end portion thereof, arranging a second set of signal pads along an edge of a second surface of the SFP board at the end portion, arranging a third set of signal pads on the second surface of the SFP board at the end portion such that the third set of signal pads are offset from the edge of the second surface, and coupling the first, second and third sets of signal pads to a transceiver configured to transmit and receive signals via signal pads of the third set and to transmit and receive signals via signal pads of at least one of the first and second set.

Further still, a method is provided comprising: transmitting and receiving signals via at least one of: a first set of signal pads disposed on along an edge of a first surface of a small form-factor pluggable (SFP) board at an end portion and a second set of signal pads disposed along the an edge of a second surface of the SFP board at the end portion; transmitting and receiving signals via a third set of signal pads disposed on the second surface of the SFP board at the end portion and offset from the edge of the second surface; and operating a transceiver coupled to the SFP board at a data rate that is higher than a data rate achievable by transmitting and receiving signals via only the first or second set of signal pads.

The above description is intended by way of example only. Various modifications and structural changes may be made therein without departing from the scope of the concepts described herein and within the scope and range of equivalents of the claims.

What is claimed is:

1. An apparatus comprising:
    a small form-factor pluggable (SFP) board with an end portion configured to be inserted into a connector device;
    a first set of signal pads disposed along an edge of a first surface of the SFP board at the end portion;
    a second set of signal pads disposed along an edge of a second surface of the SFP board at the end portion;
    a third set of signal pads disposed on the second surface of the SFP board at the end portion and offset from the edge of the second surface in a longitudinal direction of the SFP board;
    a transceiver coupled to signal pads of the first, second, and third sets of signal pads and configured to transmit and receive signals via signal pads of the third set and to transmit and receive signals via signal pads of at least one of the first and second sets; and
    a switch device coupled to one of a first or second power supply to supply either a first voltage or a second voltage to signal pads of the SFP board.

2. The apparatus of claim 1, wherein one or more pairs of signal pads of the first set and the third set are configured to operate as transmitter differential pair pads, and one or more pairs of signal pads of the first set and the third set are configured to operate as receiver differential pair pads.

3. The apparatus of claim 2, further comprising a fourth set of signal pads disposed on the first surface of the SFP board at the end portion and offset from the edge of the first surface.

4. The apparatus of claim 3, wherein one or more pairs of signal pads of the fourth set are configured to operate as transmitter differential pair pads; and one or more pairs of signal pads of the second and fourth sets are configured to operate as receiver differential pair pads.

5. The apparatus of claim 3, wherein the first, second, third and fourth sets of signal pads are each arranged as a row of signal pads.

6. The apparatus of claim 1, wherein:
    the first power supply is configured to supply the first voltage to a first signal pad of the SFP board;
    the second power supply is configured to supply the second voltage that is different from the first voltage; and
    the switch device is coupled to one of the first power supply or the second power supply to to supply either the first or the second voltage to the second signal pad according to a configuration of the SFP board.

7. In combination,
    a first one of the apparatus of claim 1, a second one of the apparatus of claim 1, and said connector device, wherein:
    the end portion of the first apparatus is configured to be inserted into a first socket of the connector device in the longitudinal direction; and
    the end portion of the second apparatus is configured to be inserted into a second socket of the connector device along the longitudinal direction such that the second apparatus is offset from the first apparatus in the longitudinal direction and in a vertical direction that is perpendicular to a plane in which the second surface of the SFP board resides.

8. An apparatus comprising:
    a connector device with stacked sockets configured to engage small form-factor pluggable (SFP) boards, each socket having a first socket surface configured to engage a first surface of an SFP board and a second socket surface configured to engage a second surface of the SFP board, wherein each of the stacked sockets are offset from each other in a longitudinal direction of the connector device and comprises:
        a first set of contacts disposed along the first socket surface that are configured to engage a first set of signal pads of the SFP board;
        a second set of contacts disposed along the second socket surface that are configured to engage a second set of signal pads of the SFP board; and
        a third set of contacts disposed along the second socket surface configured to engage a third set of signal pads of the SFP board; wherein
        the first socket surface and the second socket surface are aligned such that a plane in which the first socket surface resides is parallel to a plane in which the first surface of the SFP board resides and a plane in which the second socket surface resides is parallel to a plane in which the second surface of the SFP board resides.

9. The apparatus of claim 8, further comprising a fourth set of contacts disposed along the first surface configured to engage a fourth set of signal pads of the SFP board.

10. The apparatus of claim 9, wherein the first, second, third and fourth set of contacts are each arranged as a row of contacts.

11. The apparatus of claim 8, wherein:
    the stacked sockets are offset from each other in the longitudinal direction; and
    the stacked sockets are offset from each other in a vertical direction that is perpendicular to the plane in which the second surface of the SFP board resides.

12. A method comprising:
    arranging a first set of signal pads along an edge of a first surface of a small form-factor pluggable (SFP) board at an end portion thereof;
    arranging a second set of signal pads along an edge of a second surface of the SFP board at the end portion;
    arranging a third set of signal pads on the second surface of the SFP board at the end portion such that the third set of signal pads are offset from the edge of the second surface in a longitudinal direction of the SFP board;
    coupling the first, second and third sets of signal pads to a transceiver configured to transmit and receive signals via signal pads of the third set and to transmit and receive signals via signal pads of at least one of the first and second set; and
    switching a switch device to select one of a first or second power supply to supply either a first voltage or a second voltage to signal pads of the SFP board.

13. The method of claim 12, further comprising arranging a fourth set of signal pads on the first surface of the SFP board at the end portion such that the fourth set is offset from the edge of the first surface, wherein one or more pairs of signal pads of the first, third and fourth sets operate as transmitter differential pair pads, and one or more pairs of the first, second, third and fourth sets of signal pads operate as receiver differential pair pads.

14. The method of claim 13, wherein arranging the first, second, third and fourth set of signal pads comprises arranging each of the first, second, third and fourth set of signal pads as a row of signal pads.

15. The method of claim 12, further comprising:
supplying the first voltage to a first signal pad of the SFP board via the first power supply;
supplying the second voltage that is different from the first voltage via the second power supply; and
coupling one of the first or second power supply to a second signal pad of the SFP board via a switch device according to a configuration of the SFP board to supply either the first or the second voltage to the second signal pad.

16. A method comprising:
transmitting and receiving signals via at least one of:
a first set of signal pads disposed on along an edge of a first surface of a small form-factor pluggable (SFP) board at an end portion;
and a second set of signal pads disposed along an edge of a second surface of the SFP board at the end portion;
transmitting and receiving signals via a third set of signal pads disposed on the second surface of the SFP board at the end portion and offset from the edge of the second surface in a longitudinal direction of the SFP board;
operating a transceiver coupled to the SFP board at a data rate that is higher than a data rate achievable by transmitting and receiving signals via only the first or second set of signal pads; and
directing a switch device coupled to one of a first or second power supply to supply either a first voltage or a second voltage to signal pads of the SFP board.

17. The method of claim 16, wherein transmitting and receiving signals via the third set of signal pads comprises transmitting and receiving differential signals at one or more pairs of signal pads designated as transmitter and receiver differential pairs in the third set.

18. The method of claim 17, further comprising:
transmitting and receiving signals via a fourth set of signal pads disposed along the first surface of the SFP board at the end portion and offset from the edge of the first surface; and
operating the transceiver at a data rate that is higher than a data rate achievable by transmitting and receiving signals via only the first, second or third signal pads.

19. The method of claim 18, wherein operating the transceiver comprises operating the transceiver at a 100 Gigabit data rate.

20. The method of claim 19, wherein operating the transceiver at the 100 Gigabit data rate comprises operating the transceiver such that it is backwards compatible with a transceiver operating at a 40 Gigabit data rate.

21. The method for claim 16, wherein transmitting and receiving via a fourth set of signal pads comprises transmitting and receiving differential signals at one or more pairs of signal pads designated as transmitter and receiver differential pairs in the fourth set.

22. The method of claim 16, wherein operating the transceiver comprises operating the transceiver at a 40 Gigabit data rate.

23. The method of claim 22, wherein operating the transceiver at the 40 gigabit data rate comprises operating the transceiver such that it is backwards compatible with a transceiver operating at a 10 Gigabit data rate.

24. The method of claim 16, further comprising:
supplying the first voltage to a first signal pad of the SFP board via the first power supply;
supplying the second voltage that is different from the first voltage via the second power supply; and
coupling one of the first or second power supply to a second signal pad of the SFP board via a switch device according to a configuration of the SFP board to supply either the first or the second voltage to the second signal pad.

* * * * *